United States Patent
Banno et al.

(10) Patent No.: US 9,037,203 B2
(45) Date of Patent: May 19, 2015

(54) COMPOSITE BARRIER-TYPE NB3AI SUPERCONDUCTING MULTIFILAMENT WIRE MATERIAL

(75) Inventors: Nobuya Banno, Ibaraki (JP); Takao Takeuchi, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 169 days.

(21) Appl. No.: 13/977,990

(22) PCT Filed: Jan. 13, 2012

(86) PCT No.: PCT/JP2012/050571
§ 371 (c)(1),
(2), (4) Date: Aug. 12, 2013

(87) PCT Pub. No.: WO2012/099008
PCT Pub. Date: Jul. 26, 2012

(65) Prior Publication Data
US 2013/0316909 A1    Nov. 28, 2013

(30) Foreign Application Priority Data

Jan. 18, 2011 (JP) ................................. 2011-008007

(51) Int. Cl.
*H01B 12/10* (2006.01)
*H01B 12/08* (2006.01)
(Continued)

(52) U.S. Cl.
CPC ................ *H01B 12/08* (2013.01); *H01L 39/14* (2013.01); *H01L 39/2409* (2013.01)

(58) Field of Classification Search
CPC ......... H01L 39/02; H01L 39/12; H01L 39/14; H01L 39/24; H01L 39/2403; H01L 39/2406; H01L 39/2409; H01B 12/06; H01B 12/08; H01B 12/10; H01B 13/00

USPC .......... 505/230, 231, 232, 430, 431; 174/125.1; 29/599; 148/98
See application file for complete search history.

(56) References Cited

U.S. PATENT DOCUMENTS 5,753,862 A * 5/1998 Kubo et al. ................ 174/125.1
6,376,099 B1 * 4/2002 Inoue et al. ................... 428/615
(Continued)

FOREIGN PATENT DOCUMENTS

JP         9-134619      5/1997
JP         2001-052547   2/2001
(Continued)

OTHER PUBLICATIONS

International Search Report issued Feb. 14, 2012 in International (PCT) Application No. PCT/JP2012/050571.
(Continued)

*Primary Examiner* — Stanley Silverman
*Assistant Examiner* — Kallambella Vijayakumar
(74) *Attorney, Agent, or Firm* — Wenderoth, Lind & Ponack, L.L.P.

(57) ABSTRACT

A composite barrier-type $Nb_3Al$ superconducting multifilament wire material comprises Nb barrier filaments, Ta barrier filaments, Nb bulk dummy filaments, and a Nb or Ta covering. In the composite barrier-type $Nb_3Al$ superconducting multifilament wire material, the Nb barrier filaments and Ta barrier filaments are disposed in the wire material so that the Nb barrier filaments are concentrated in a filament region near a core formed from the Nb bulk dummy filaments and only the Ta barrier filaments are disposed or the Nb barrier filaments are dispersed in the Ta barrier filaments in an outer layer portion formed from a region outside the Nb barrier filaments, excluding the Nb or Ta covering.

6 Claims, 10 Drawing Sheets

(51) Int. Cl.
*H01L 39/14* (2006.01)
*H01L 39/24* (2006.01)

(56) References Cited

U.S. PATENT DOCUMENTS

| | | | | |
|---|---|---|---|---|
| 6,543,123 | B1* | 4/2003 | Wong | 29/599 |
| 2005/0178472 | A1* | 8/2005 | Hong et al. | 148/98 |
| 2006/0032042 | A1* | 2/2006 | Hong et al. | 29/599 |
| 2009/0038822 | A1* | 2/2009 | Thoener et al. | 174/125.1 |

FOREIGN PATENT DOCUMENTS

| | | | | |
|---|---|---|---|---|
| JP | 2002-033025 | | 1/2002 | |
| JP | 2003-223823 | | 8/2003 | |
| JP | 2005-085555 | * | 3/2005 | ............ H01B 12/10 |
| JP | 2010-182470 | | 8/2010 | |
| JP | 2010-223823 | * | 8/2010 | ............ H01B 12/08 |
| JP | 2010-282930 | * | 12/2010 | ............ H01B 12/10 |

OTHER PUBLICATIONS

Takeuchi et al., "Status and perspective of the $Nb_3Al$ development", Cryogenics, vol. 48, 2008, pp. 371-380.

Banno et al., "Design of Transformation-Processed $Nb_3Al$ Conductors to Balance Drawability and Inter-Filament Decoupling", IEEE Transaction on Applied Superconductivity, vol. 23, No. 3, Jun. 2013.

* cited by examiner

US 9,037,203 B2

COMPOSITE BARRIER-TYPE NB3AI SUPERCONDUCTING MULTIFILAMENT WIRE MATERIAL

TECHNICAL FIELD

The present invention relates to a composite barrier-type $Nb_3Al$ superconducting multifilament wire material.

BACKGROUND ART

In a $Nb_3Al$ superconducting multifilament wire material produced by a rapid-heating and quenching process, as a barrier material for $Nb_3Al$ superconducting filaments, there has been used Nb which is a high melting-point material having excellent ductility and having a melting point of higher than 2,000° C. However, Nb has a critical temperature of about 9 K and exhibits superconductivity in an environment at extremely low temperatures, and therefore induces magnetic coupling of the filaments. On the other hand, for suppressing such magnetic coupling, an attempt has been made to use Ta which is a high melting-point material having low superconductivity. However, Ta has poor ductility and hence increases a risk of wire breakage during the wire drawing processing.

The matrix material used in the $Nb_3Al$ superconducting multifilament wire material produced by a rapid-heating and quenching process is limited to Nb or Ta which is a high melting-point metal because of the special ultrahigh temperature treatment conducted for the wire material. For this reason, there have been only two types of $Nb_3Al$ superconducting multifilament wire materials produced by a rapid-heating and quenching process, i.e., an all-Nb barrier filament wire material in which, as shown in FIG. 1, $Nb_3Al$ superconducting filaments having a Nb barrier are disposed around a dummy core formed from Nb, and an all-Ta barrier filament wire material in which, as shown in FIG. 2, $Nb_3Al$ superconducting filaments having a Ta barrier are disposed around a dummy core formed from Nb or Ta.

The all-Nb barrier filament wire material has excellent processability; however, when used in an environment at extremely low temperatures, as mentioned above, the superconductivity of Nb causes the filaments to be magnetically coupled with each other, that is, a so-called filament coupling phenomenon occurs. Therefore, the all-Nb barrier filament wire material behaves like a single bulk of wire, though it has a very fine multifilament structure, so that an unstable phenomenon called flux jump due to an increase of the magnetization occurs, thus causing an increase of the magnetic hysteresis loss.

As a new wire material for suppressing coupling of the filaments caused due to the superconductivity of Nb, the all-Ta barrier filament wire material using Ta, which is a high melting-point material having low superconductivity, as a barrier material has been developed. This wire material suppresses magnetic coupling of the filaments; however, the wire material has poor wire drawing processability, as compared to the wire material using a Nb barrier, and therefore, as mentioned above, another problem arises in that the risk of wire breakage during the wire drawing processing is increased.

For solving the above problems, studies have been made on a method of adding an alloy to the Nb barrier so that the Nb barrier has normal conductivity, and a method for improving the wire drawing processability of the Ta matrix by controlling the purity of or annealing conditions for a Ta rolled sheet used as a Ta barrier. However, any of these methods cannot achieve satisfactory wire drawing processability, and the problems have not yet been fundamentally solved.

JP-A-2002-33025
JP-A-2006-85555
K. Tsuchiya, T. Takeuchi, N. Banno et al., "Study of $Nb_3Al$ Wires for High-field Accelerator Magnet Applications", IEEE Trans. Appl. Supercond., vol. 20, pp. 1411-1414, 2010.
N. Banno, T. Takeuchi et al., "Minimization of the hysteresis loss and low-field instability in technical $Nb_3Al$ conductors", Supercond. Sci, Technol., vol. 21, 115020 (7 pp), 2008
T. Takeuchi, A. Kikuchi, N. Banno et al., "Status and perspective of the $Nb_3Al$ development", Cryogenics, vol. 48, pp. 371-380, 2008

SUMMARY OF INVENTION

Technical Problem

In the present invention, there is provided an innovative $Nb_3Al$ superconducting multifilament wire material which solves the above problems. Specifically, there is provided a composite barrier-type $Nb_3Al$ superconducting multifilament wire material which can suppress magnetic coupling of the filaments while maintaining excellent wire drawing processability.

From the attempts which have been made to produce wire materials, it has been found that the breakage of wire material during the wire drawing process is a so-called center burst and is caused from around the core at which the deforming stress is unlikely to arrive as a starting point. In other words, the starting point of the wire breakage is concentrated in a portion around the dummy forming the core. Particularly, this phenomenon is more likely to be seen in the Ta barrier filament wire material, and the poor wire drawing processability of Ta has been considered as the chief cause of the phenomenon, but satisfactory studies of the effect of the cross-sectional construction of the wire material on wire breakage have not been made.

In this situation, in the invention, by employing a new cross-sectional construction such that the Nb barrier filaments are concentrated in a region positioned around the dummy core, in which there is a large risk of wire breakage, and only the Ta barrier filaments for suppressing magnetic coupling of the filaments are disposed in an outer layer portion formed from a region outside the region in which there is a large risk of wire breakage, excluding the covering, or the Nb barrier filaments are dispersed in the Ta barrier filaments in the outer layer portion, magnetic coupling of the filaments can be suppressed while maintaining excellent wire drawing processability.

Solution to Problem

Specifically, the composite barrier-type $Nb_3Al$ superconducting multifilament wire material of the invention comprises Nb barrier filaments, Ta barrier filaments, Nb bulk dummy filaments, and a Nb or Ta covering, wherein the Nb barrier filaments and Ta barrier filaments are disposed in the wire material so that the Nb barrier filaments are concentrated in a filament region near a core formed from the Nb bulk dummy filaments and only the Ta barrier filaments are disposed or the Nb barrier filaments are dispersed in the Ta barrier filaments in an outer layer portion formed from a region outside the Nb barrier filaments, excluding the Nb or Ta covering.

In the composite barrier-type Nb₃Al superconducting multifilament wire material of the invention, it is preferred that one or a plurality of the Nb barrier filaments are dispersed in a plurality of the Ta barrier filaments in the outer layer portion.

In the composite barrier-type Nb₃Al superconducting multifilament wire material of the invention, it is preferred that the Nb barrier filaments are Nb barrier filaments each obtained by rolling a Nb sheet and an Al sheet into a jelly roll and forming a Nb layer around the roll and subjecting the resultant roll to wire drawing processing.

In the composite barrier-type Nb₃Al superconducting multifilament wire material of the invention, it is preferred that the Ta barrier filaments are Ta barrier filaments each obtained by rolling a Nb sheet and an Al sheet into a jelly roll and forming a Ta layer around the roll and subjecting the resultant roll to wire drawing processing.

In the composite barrier-type Nb₃Al superconducting multifilament wire material of the invention, it is preferred that the cross-sectional occupancy rate of the Nb bulk dummy filaments is 3 to 20%, the cross-sectional occupancy rate of the Nb barrier filaments disposed in the filament region near the core is 4 to 40%, the cross-sectional occupancy rate of the covering is 5 to 30%, and the remaining cross-sectional area is occupied by the outer layer portion.

In the composite barrier-type Nb₃Al superconducting multifilament wire material of the invention, it is preferred that the cross-sectional occupancy rate of the Nb barrier filaments in the outer layer portion is 0 to 80%.

Advantageous Effects of Invention

In the invention, not only can excellent wire drawing processability such that no wire breakage is caused even when the area reduction rate is 99% or more be achieved, but also magnetic coupling of the filaments can be suppressed.

DESCRIPTION OF EMBODIMENTS

The invention has the above-mentioned characteristic feature, and an embodiment of the invention is described below.

Figure 1:
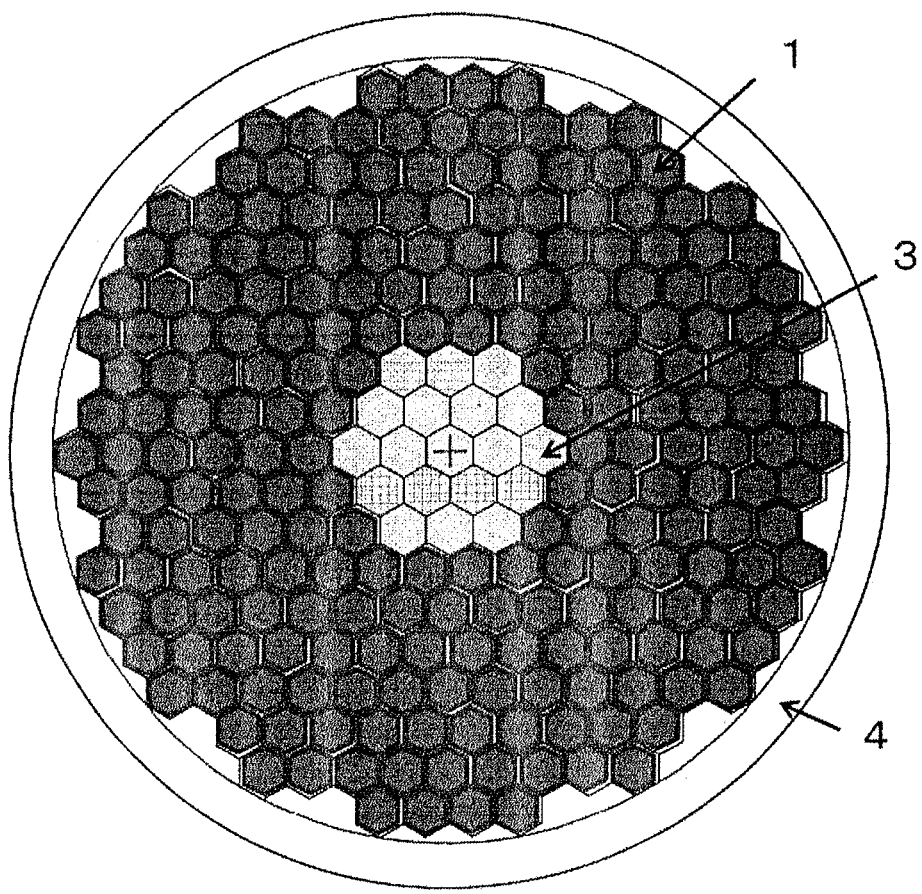
FIG. 1 shows a cross-sectional structure of an all-Nb barrier filament wire material.
Figure 2:
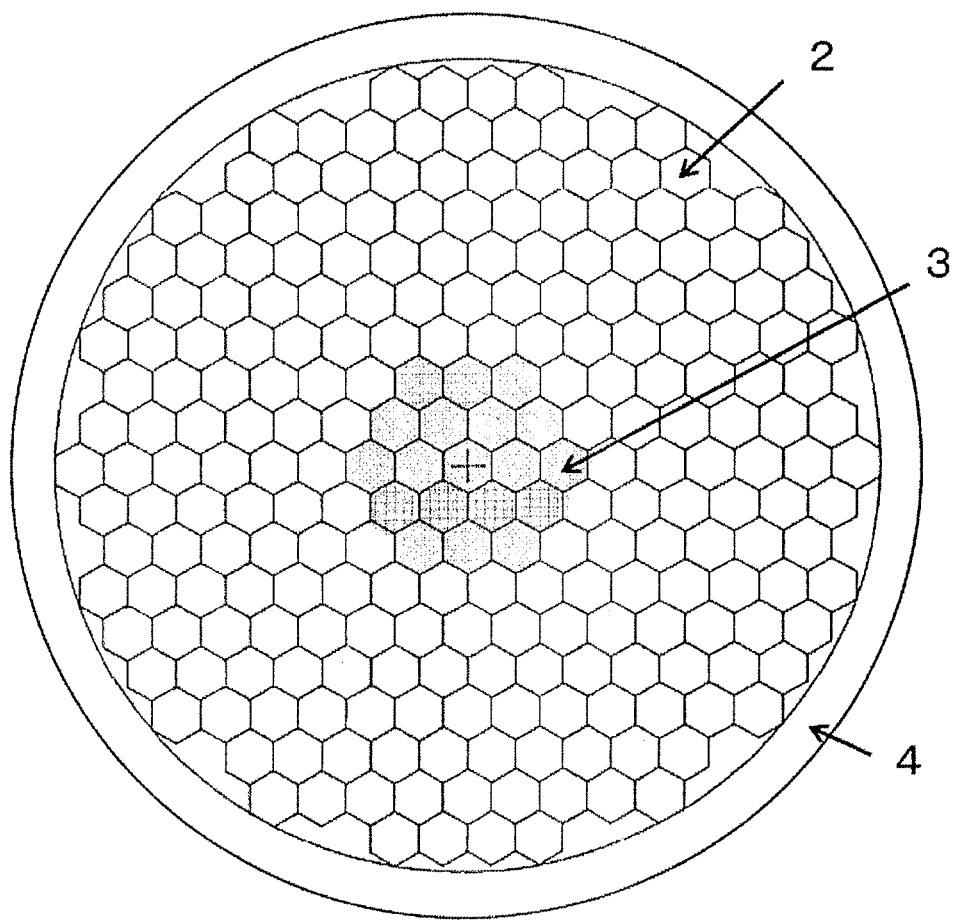
FIG. 2 shows a cross-sectional structure of an all-Ta barrier filament wire material.
Figure 3:
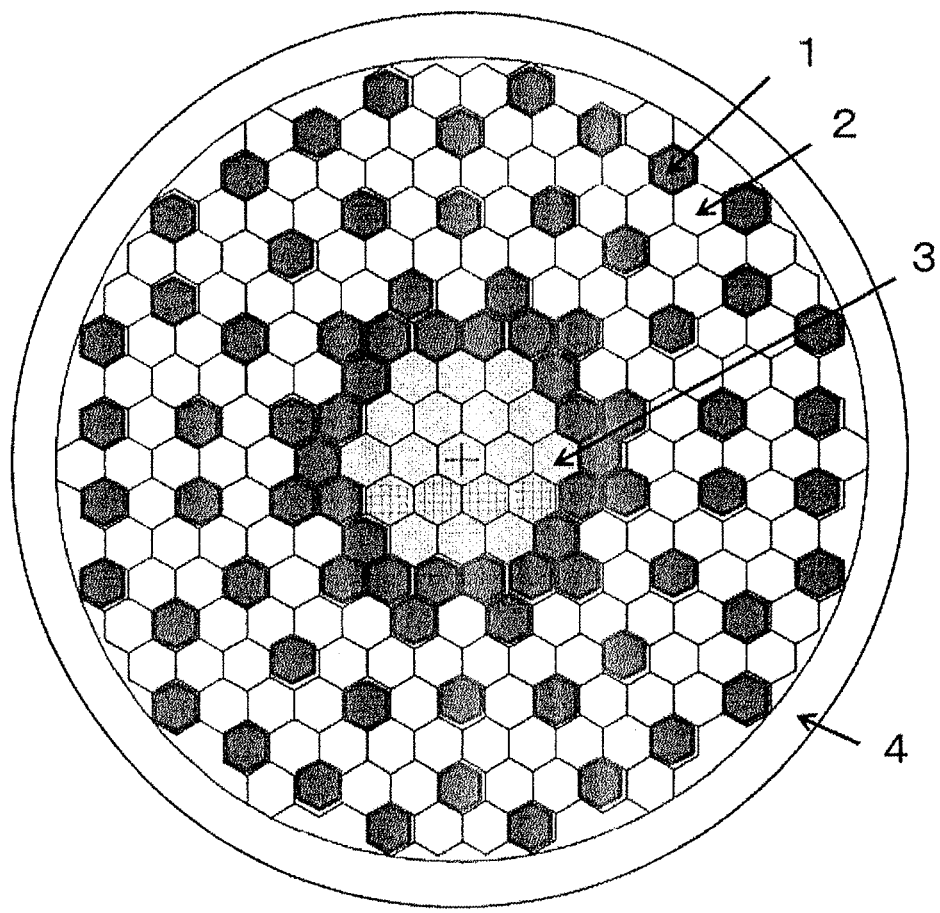
FIG. 3 shows one mode of a cross-sectional structure of the composite barrier-type Nb₃Al superconducting multifilament wire material of the invention.

FIG. 3 is a cross-sectional view of a composite barrier-type Nb₃Al superconducting multifilament wire material according to one embodiment of the invention. The composite barrier-type Nb₃Al superconducting multifilament wire material is a superconducting multifilament wire material of a composite barrier type formed from Nb barrier filaments 1 produced by, for example, rolling a Nb sheet and an Al sheet into a jelly roll and forming a Nb layer around the roll and subjecting the resultant roll to drawing processing, Ta barrier filaments 2 produced by, for example, rolling a Nb sheet and an Al sheet into a jelly roll and forming a Ta layer around the roll and subjecting the resultant roll to wire drawing processing, and Nb bulk dummy filaments 3. In addition to the Nb barrier filaments 1, Ta barrier filaments 2, and Nb bulk dummy filaments 3, the composite barrier-type Nb₃Al superconducting multifilament wire material has a Nb or Ta covering 4. The Nb bulk dummy filaments 3 can be produced by, for example, drawing processing.

In the composite barrier-type Nb₃Al superconducting multifilament wire material, the Nb barrier filaments 1 and Ta barrier filaments 2 are disposed so that the Nb barrier filaments 1 are concentrated in a filament region near a core formed from the Nb bulk dummy filaments 3 and the Nb barrier filaments 1 are dispersed in the Ta barrier filaments 2 in an outer layer portion formed from a region outside the Nb barrier filaments 1, excluding the Nb or Ta covering 4, and thus the Nb barrier filaments 1 are scattered in the outer layer portion.

The above-mentioned composite barrier-type Nb₃Al superconducting multifilament wire material is produced by a rapid-heating and quenching process, and, for fully utilizing excellent wire drawing processability of Nb which is a high melting-point metal, the Nb barrier filaments 1 having Nb as a barrier material are concentrated in the filament region near the core formed from the Nb bulk dummy filaments 3, maintaining excellent wire drawing processability. Further, the Nb barrier filaments 1 are dispersed in the Ta barrier filaments 2 in the outer layer portion formed from a region outside the concentrated Nb barrier filaments 1, excluding the Nb or Ta covering 4, and thus magnetic coupling of the filaments, which is caused due to the Nb barrier filaments 1 present adjacent to each other all over the cross-section of wire, is disconnected by the Ta barrier filaments 2. Therefore, magnetic coupling of the filaments caused through the Nb barrier at extremely low temperatures can be suppressed.

Figure 4:
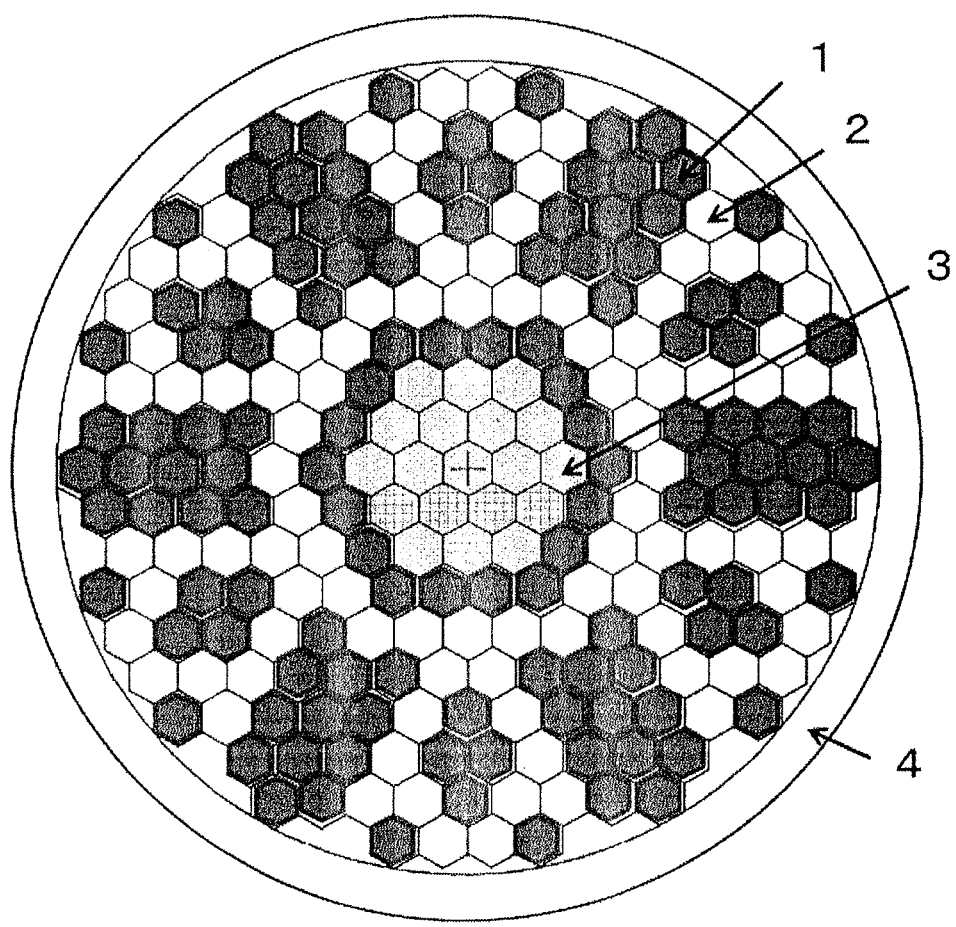
FIG. 4 shows one mode of a cross-sectional structure of the composite barrier-type Nb₃Al superconducting multifilament wire material of the invention.
Figure 5:
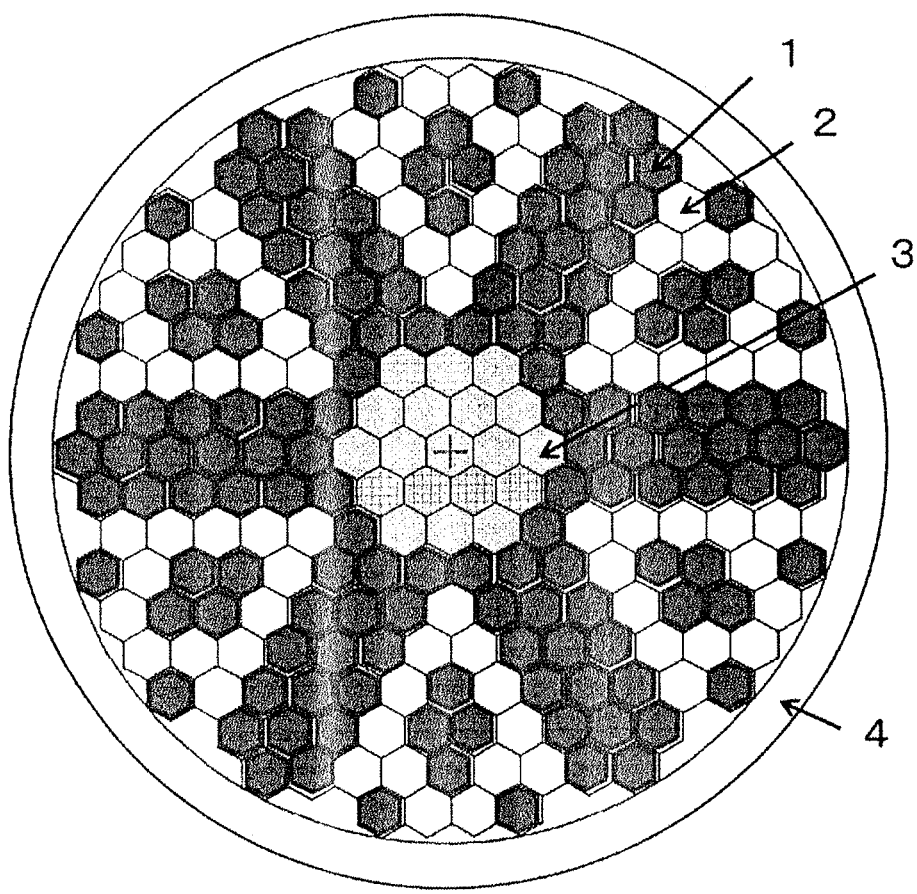
FIG. 5 shows one mode of a cross-sectional structure of the composite barrier-type Nb₃Al superconducting multifilament wire material of the invention.
Figure 6:
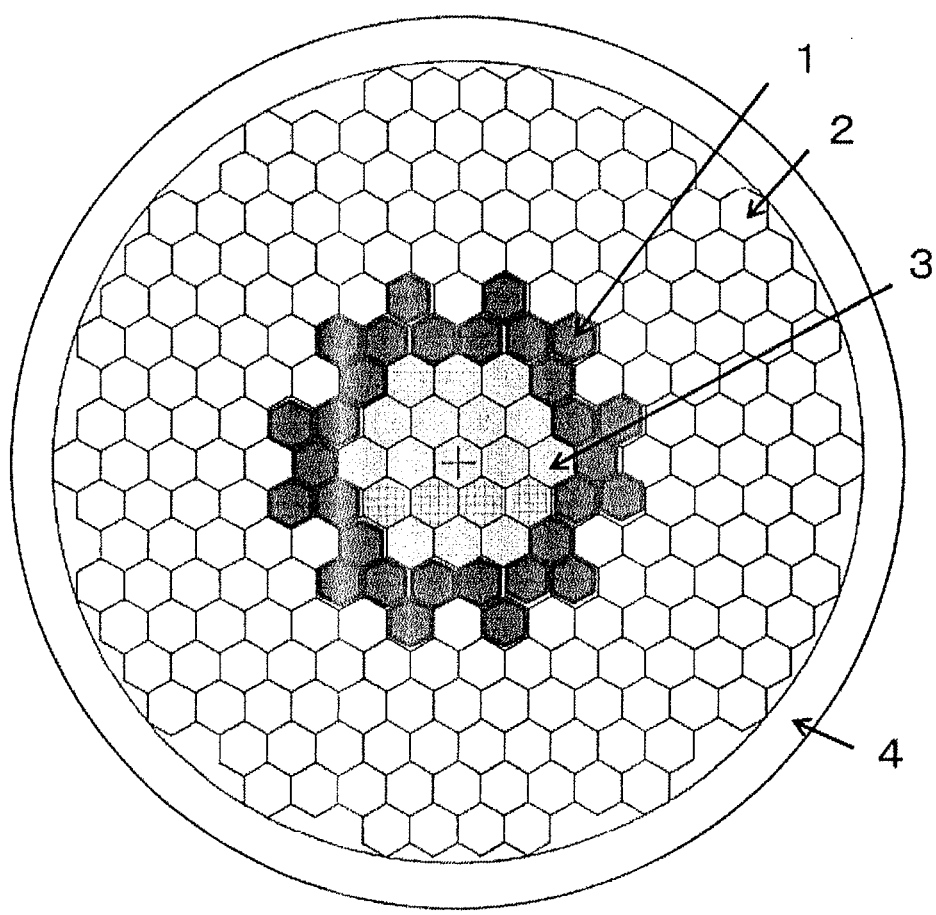
FIG. 6 shows one mode of a cross-sectional structure of the composite barrier-type Nb₃Al superconducting multifilament wire material of the invention.

As examples of cross-sectional constructions of the composite barrier-type Nb₃Al superconducting multifilament wire material, there can be mentioned that shown in FIG. 3, and a cross-sectional construction in which, as shown in FIG. 4, the Nb barrier filaments 1 are dispersed in the Ta barrier filaments 2 in the outer layer portion formed from a region outside the concentrated Nb barrier filaments 1, excluding the Nb or Ta covering 4, so that the Nb barrier filaments 1 are disposed so as to constitute island portions. Further, there can be mentioned a cross-sectional construction in which, as shown in FIG. 5, the Nb barrier filaments 1 are dispersed in the Ta barrier filaments 2 in the outer layer portion so that the Nb barrier filaments 1 are disposed in a radial pattern, and a cross-sectional construction in which, as shown in FIG. 6, only the Ta barrier filaments 2 are disposed in the outer layer portion. The cross-sectional construction of the composite barrier-type $Nb_3Al$ superconducting multifilament wire material is not limited to the above examples, and an arbitrary cross-sectional construction can be employed as long as the Nb barrier filaments 1 are dispersed in the Ta barrier filaments 2 in the outer layer portion or only the Ta barrier filaments 2 are disposed in the outer layer portion.

Further, in the composite barrier-type $Nb_3Al$ superconducting multifilament wire material, a preferred arrangement of the filaments effective in suppressing magnetic coupling of the filaments while maintaining excellent wire drawing processability is as follows. Specifically, the cross-sectional occupancy rate of the Nb bulk dummy filaments 3 is 3 to 20%, the cross-sectional occupancy rate of the Nb barrier filaments 1 disposed in the filament region near the core is 4 to 40%, the cross-sectional occupancy rate of the covering 4 is 5 to 30%, and the remaining cross-sectional area is occupied by the outer layer portion in which only the Ta barrier filaments 2 are disposed or the Nb barrier filaments 1 are dispersed in the Ta barrier filaments 2. The cross-sectional occupancy rate means an area rate in the cross-section.

When the cross-sectional occupancy rate of the Nb bulk dummy filaments 3 is less than 3%, satisfactory wire drawing processability cannot be obtained even by using only the Nb barrier filaments 1 in the filament region, so that the risk of wire breakage is dramatically increased. On the other hand, when the cross-sectional occupancy rate of the Nb bulk dummy filaments 3 is 20% or less, a satisfactory effect is obtained in reducing the risk of wire breakage, and, when the cross-sectional occupancy rate of the Nb bulk dummy filaments 3 exceeds 20%, the cross-sectional occupancy rate of the superconducting portion inside the wire material is reduced, making it difficult to maintain excellent superconducting current characteristics. Therefore, it is preferred that the cross-sectional occupancy rate of the Nb bulk dummy filaments 3 is 3 to 20%.

When the cross-sectional occupancy rate of the Nb barrier filaments 1 disposed in the filament region near the core is less than 4%, the Nb barrier filaments 1 in a satisfactory amount cannot be disposed around the core, and the risk of wire breakage is predicted to be increased. On the other hand, when the cross-sectional occupancy rate of the Nb barrier filaments 1 exceeds 40%, a layer surrounding the core, in which the filaments are coupled, is increased in thickness, so that a satisfactory effect of the composite barrier type cannot be obtained. Therefore, it is preferred that the cross-sectional occupancy rate of the Nb barrier filaments 1 disposed in the filament region near the core is 4 to 40%.

When the cross-sectional occupancy rate of the covering 4 is less than 5%, the covering 4 suffers a breakage during the wire drawing processing, and further a satisfactory strength cannot be maintained during the rapid-heating and quenching treatment at a temperature as high as 2,000° C., increasing the possibility that wire breakage is caused. On the other hand, when the cross-sectional occupancy rate of the covering 4 is 30% or less, a satisfactory effect is obtained in improving the processability or strength, and, when the cross-sectional occupancy rate of the covering 4 exceeds 30%, the cross-sectional occupancy rate of the superconducting portion inside the wire material is reduced, making it difficult to maintain excellent superconducting current characteristics. Therefore, it is preferred that the cross-sectional occupancy rate of the covering 4 is 5 to 30%.

The remaining filament region is occupied by the outer layer portion, and it is preferred that the cross-sectional occupancy rate of the Nb barrier filaments 1 in the outer layer portion is 0 to 80%. In the outer layer portion, there is a small risk of wire breakage, and, even when the Nb barrier filaments 1 are not disposed but only the Ta barrier filaments 2 are disposed, namely, the cross-sectional occupancy rate of the Nb barrier filaments 1 in the outer layer portion is 0%, it is expected that satisfactory wire drawing processability can be maintained. Further, for maintaining the effect of remarkably improving the wire drawing processability and suppressing magnetic coupling of the filaments, it is preferred that the cross-sectional occupancy rate of the Nb barrier filaments 1 in the outer layer portion is 80% or less. When the cross-sectional occupancy rate of the Nb barrier filaments 1 in the outer layer portion exceeds 80%, the Nb barrier filaments 1 are coupled with each other all over the filament region, making it difficult to disconnect the coupling of the Nb barrier filaments by the Ta barrier filaments 2.

For finally obtaining excellent current characteristics of the $Nb_3Al$ superconducting multifilament wire material, it is preferred that the core portions of the Nb barrier filaments 1 and Ta barrier filaments 2 have a Nb/Al ratio of 2.3 to 4, in terms of the atomic ratio.

EXAMPLES

A composite barrier-type $Nb_3Al$ superconducting multifilament wire material in which the total number of filaments is 241 as shown in FIG. 3 was produced. In this wire material, the number of Nb bulk dummy filaments was 19 (cross-sectional occupancy rate: 7%), the number of Nb barrier filaments in the filament region near the core was 30 (cross-sectional occupancy rate: 11%), the number of Ta barrier filaments in the outer layer portion was 144, and the number of Nb barrier filaments was 48 (the cross-sectional occupancy rate of the Nb barrier filaments in the outer layer portion was 25%). In the covering, Ta (cross-sectional occupancy rate: 13%) was used. The core portions of the Nb barrier filaments and Ta barrier filaments had a Nb/Al ratio of 3, in terms of the atomic ratio.

The above composite barrier-type $Nb_3Al$ superconducting multifilament wire material was produced as follows. The Nb barrier filaments and Ta barrier filaments were prepared and extruded by a jelly roll process, and subjected to wire drawing using a hard metal dice so that the outer diameter became 2 mm. The obtained Nb barrier filaments and Ta barrier filaments and the Nb bulk dummy filaments were disposed as shown in FIG. 3, and a Ta sheet as a covering was wound round the filaments several times, and the resultant material was subjected to hydrostatic extrusion, and then subjected to wire drawing processing using a hard metal dice. The wire drawing processing was able to be performed by only a conventional technique.

The results have confirmed that, in a conventional all-Ta barrier filament wire material, wire breakage is caused when the area reduction rate is 95% in the wire drawing processing, whereas the composite barrier-type $Nb_3Al$ superconducting multifilament wire material has excellent processability such that no wire breakage is caused even when the area reduction rate is 99% or more.

Figure 7:
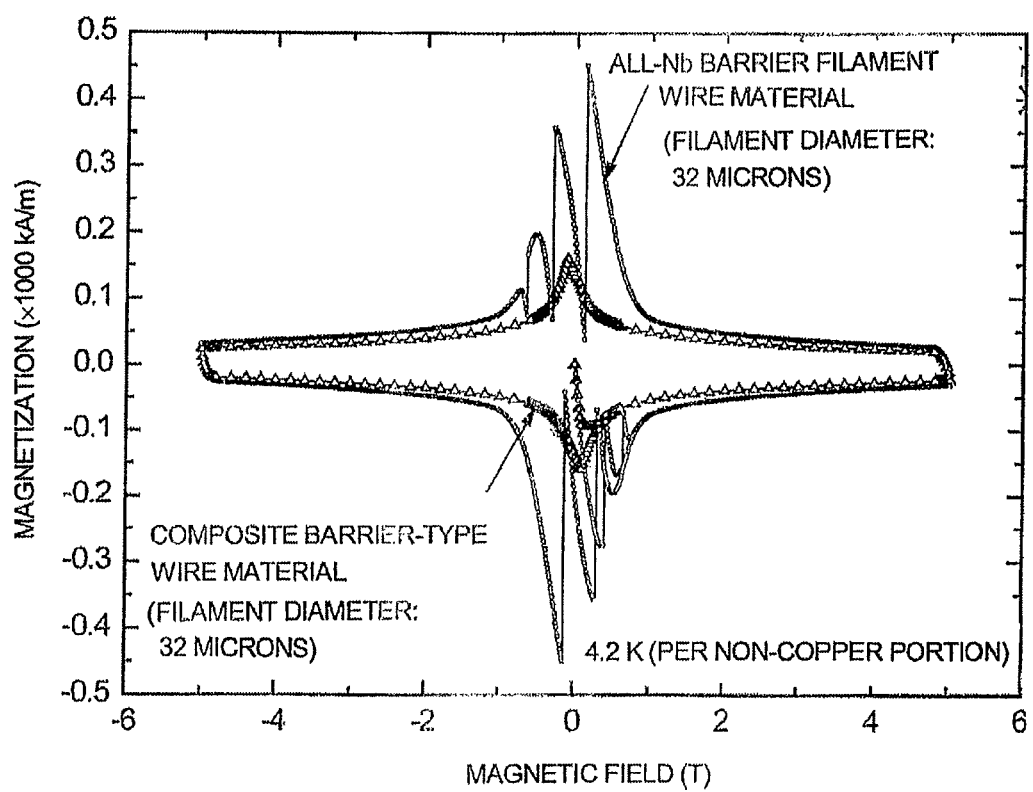
FIG. 7 shows a comparison in magnetization curve between an all-Nb barrier filament wire material and the composite barrier-type Nb₃Al superconducting multifilament wire material.

Then, the processed wire material was subjected to rapid-heating and quenching treatment at about 2,000° C. to form a Nb—Al supersaturated solid solution phase, and subsequently subjected to heat treatment at 800° C. for 10 hours so that phase transformation was caused to form a $Nb_3Al$ superconducting phase, followed by measurement of magnetization by SQUID. The results have confirmed that, as shown in FIG. 7, the magnetization is drastically suppressed, as compared to the magnetization of the all-Nb barrier filament wire material, which is increased due to magnetic coupling of the filaments. The marked increase of the magnetization on the low magnetic field side seen in the all-Nb barrier filament wire material indicates a phenomenon of magnetic coupling of the filaments. The composite barrier-type $Nb_3Al$ superconducting multifilament wire material has an effect of suppressing magnetic coupling of the filaments.

Figure 8:
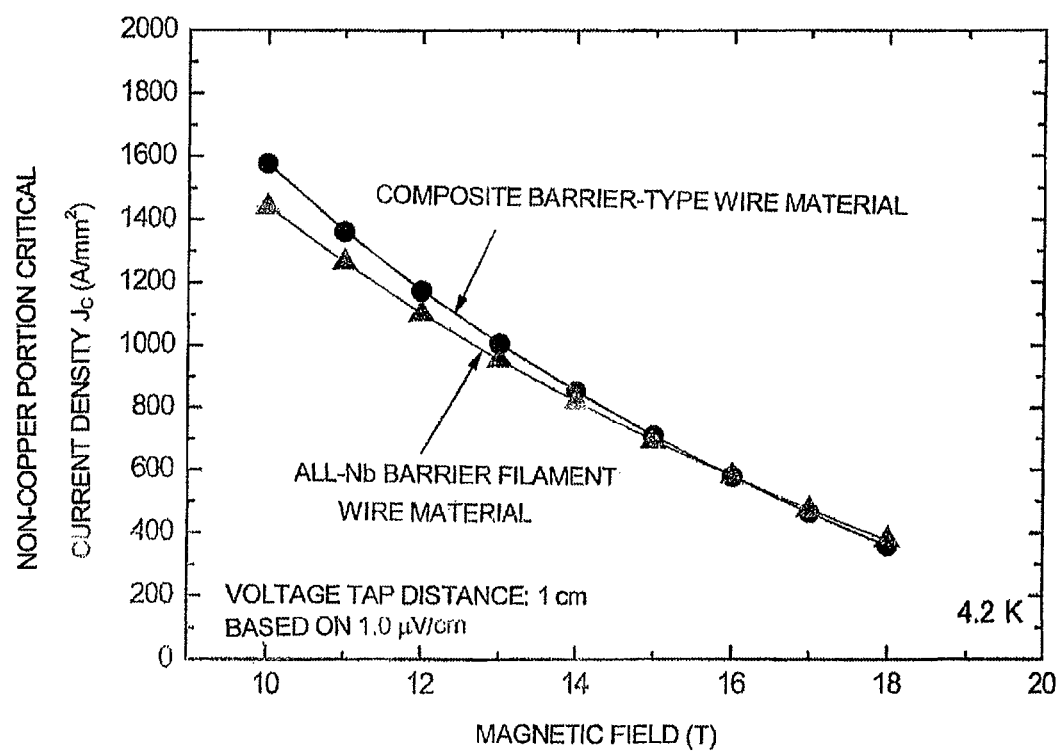
FIG. 8 shows a comparison in critical current density characteristics between an all-Nb barrier filament wire material and the composite barrier-type Nb₃Al superconducting multifilament wire material.

The composite barrier-type $Nb_3Al$ superconducting multifilament wire material has critical current characteristics such that, as shown in FIG. 8, the value of the non-copper portion per cross-sectional area of the wire material in a magnetic field at 15 T is 700 $A/mm^2$, which confirms that the composite barrier-type $Nb_3Al$ superconducting multifilament wire material has performance equivalent to that of a conventional $Nb_3Al$ superconducting multifilament wire material.

Needless to say, the present invention is not limited to the above-mentioned examples, and the details of the invention can be various embodiments.

Figure 9:
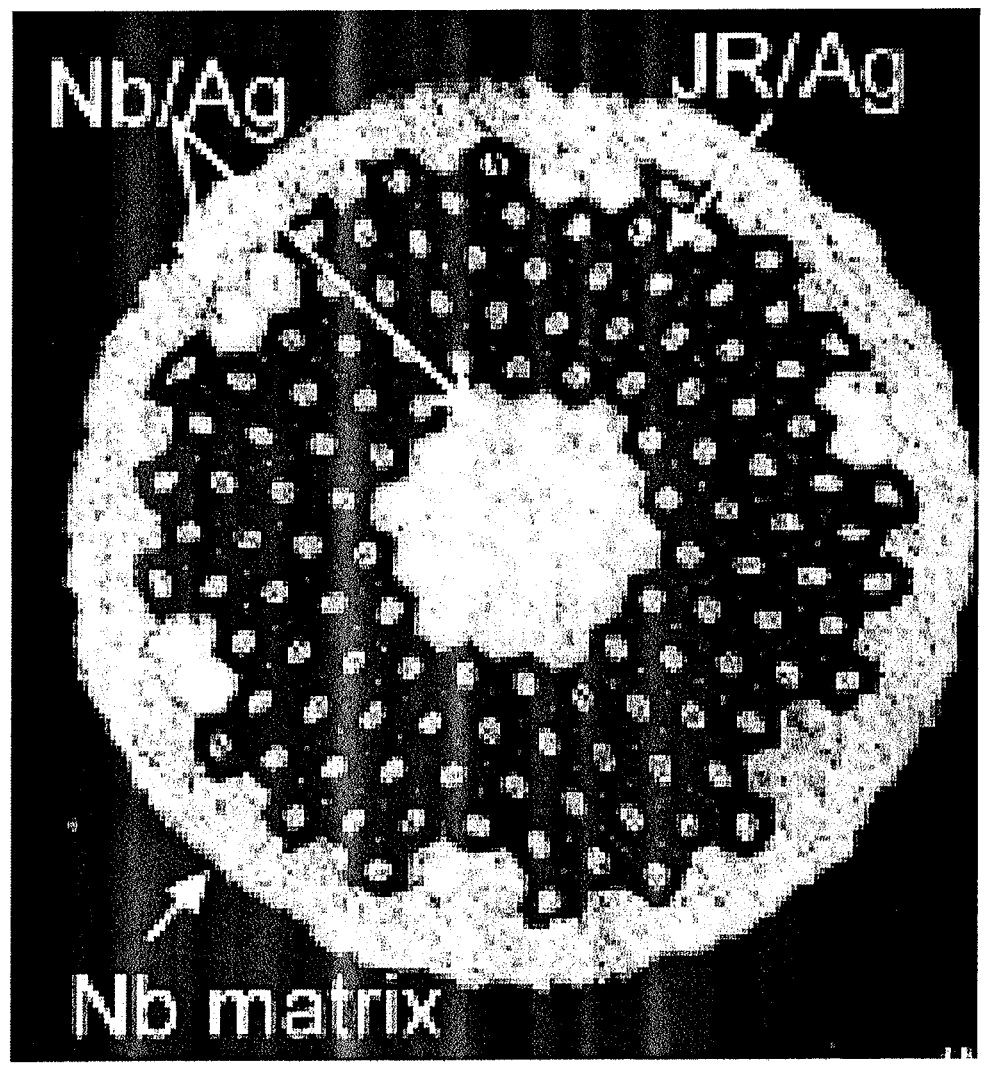
FIG. 9 is a photograph showing a cross-sectional structure of the Nb₃Al superconducting wire material internally stabilized by Ag.
Figure 10:
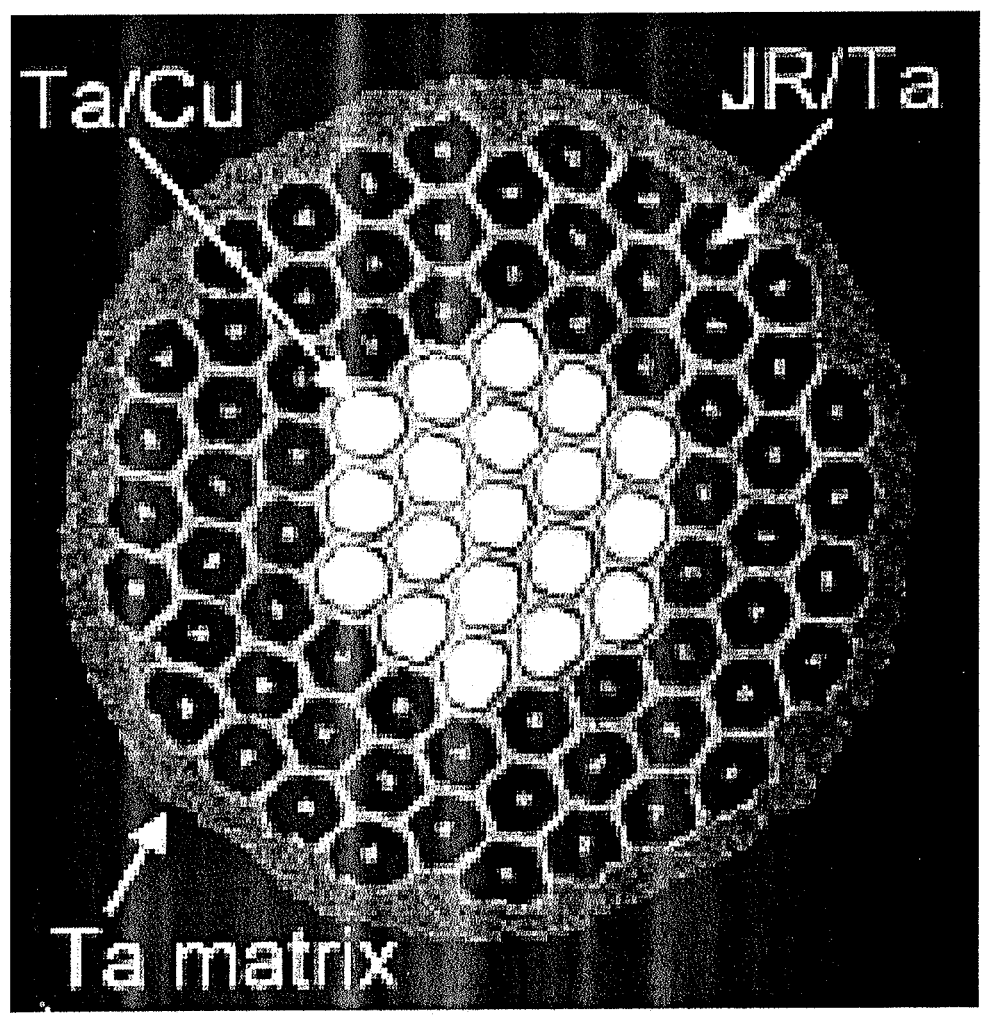
FIG. 10 is a photograph showing a cross-sectional structure of the Nb₃Al superconducting wire material internally stabilized by Cu.

For example, the $Nb_3Al$ wire materials produced by a rapid-heating and quenching process include a so-called internally stabilized wire material in which, as shown in FIGS. 9 and 10, the core portion of the Nb barrier filament or Ta barrier filament is not formed from a Nb/Al composite material and filaments buried in Cu or Ag are disposed in the core portion, and this internally stabilized wire material is intended for the improvement of the electricity conduction stability and does not solve the problems of the wire drawing processability and suppression of filament coupling. The internally stabilized wire material can be applied to the composite barrier-type $Nb_3Al$ superconducting multifilament wire material of the invention. Specifically, as shown in FIGS. 9 and 10, part of the Nb bulk dummy filaments can be replaced by Cu or Ag filaments covered with Ta or Nb as long as the composite barrier-type $Nb_3Al$ superconducting multifilament wire material has a structure in which the Nb barrier filaments are concentrated in the filament region near the core. Similarly, Cu or Ag filaments covered with Ta or Nb can be partially disposed in the outer layer portion.

Further, the Nb barrier filaments and Ta barrier filaments are not limited to those produced by a jelly roll process using a Nb sheet and an Al sheet, and may be those in which a fine diffusion couple of Nb and Al for forming a $Nb_3Al$ phase is formed. The Nb barrier filaments and Ta barrier filaments can also be produced by, for example, a rod-in-tube process using a Nb tube and an Al core, or a powder-in-tube process for producing filaments by filling a mixed powder of a Nb powder and an Al powder.

INDUSTRIAL APPLICABILITY

The present invention can solve the problems of a risk of wire breakage and magnetic coupling of the filaments, and further achieves superconducting properties equivalent to or higher than those of a conventional $Nb_3Al$ superconducting multifilament wire material. Therefore, as specific examples of applications of the wire material of the invention, there can be mentioned large-scale high magnetic-field magnets provided in a high resolution NMR analyzer at a level of 20 T, a nuclear fusion demonstration reactor, a high energy particle accelerator, and the like.

1: Nb barrier filament
2: Ta barrier filament
3: Nb bulk dummy filament
4: Nb or Ta covering

The invention claimed is:

1. A composite barrier-type $Nb_3Al$ superconducting multifilament wire material comprising Nb barrier filaments, Ta barrier filaments, Nb bulk dummy filaments, and a Nb or Ta covering, wherein the Nb barrier filaments and Ta barrier filaments are disposed in the wire material so that the Nb barrier filaments are concentrated in a filament region near a core formed from the Nb bulk dummy filaments and only the Ta barrier filaments are disposed or the Nb barrier filaments are dispersed in the Ta barrier filaments in an outer layer portion formed from a region outside the Nb barrier filaments, excluding the Nb or Ta covering.

2. The composite barrier-type $Nb_3Al$ superconducting multifilament wire material according to claim 1, wherein one or a plurality of the Nb barrier filaments are dispersed in a plurality of the Ta barrier filaments in the outer layer portion.

3. The composite barrier-type $Nb_3Al$ superconducting multifilament wire material according to claim 1, wherein the Nb barrier filaments are Nb barrier filaments each obtained by rolling a Nb sheet and an Al sheet into a jelly roll and forming a Nb layer around the roll and subjecting the resultant roll to wire drawing processing.

4. The composite barrier-type $Nb_4Al$ superconducting multifilament wire material according to claim 1, wherein the Ta barrier filaments are Ta barrier filaments each obtained by rolling a Nb sheet and an Al sheet into a jelly roll and forming a Ta layer around the roll and subjecting the resultant roll to wire drawing processing.

5. The composite barrier-type $Nb_3Al$ superconducting multifilament wire material according to claim 1, wherein the cross-sectional occupancy rate of the Nb bulk dummy filaments is 3 to 20%, the cross-sectional occupancy rate of the Nb barrier filaments disposed in the filament region near the core is 4 to 40%, the cross-sectional occupancy rate of the covering is 5 to 30%, and the remaining cross-sectional area is occupied by the outer layer portion.

6. The composite barrier-type $Nb_3Al$ superconduating multifilament wire material according to claim 5, wherein the cross-sectional occupancy rate of the Nb barrier filaments in the outer layer portion is 0 to 80%.

\* \* \* \* \*